United States Patent
Takizawa et al.

(10) Patent No.: US 11,758,743 B2
(45) Date of Patent: Sep. 12, 2023

(54) SEMICONDUCTOR FILM AND METHOD OF PRODUCING THE SAME, PHOTOELECTRIC CONVERSION ELEMENT, SOLID-STATE IMAGING ELEMENT AND ELECTRONIC APPARATUS

(71) Applicant: SONY CORPORATION, Tokyo (JP)

(72) Inventors: Syuuiti Takizawa, Tokyo (JP); Michinori Shiomi, Kanagawa (JP)

(73) Assignee: Sony Corporation, Tokyo (JP)

( * ) Notice: Subject to any disclaimer, the term of this patent is extended or adjusted under 35 U.S.C. 154(b) by 1228 days.

(21) Appl. No.: 16/317,371

(22) PCT Filed: Jun. 6, 2017

(86) PCT No.: PCT/JP2017/020973
§ 371 (c)(1),
(2) Date: Jan. 11, 2019

(87) PCT Pub. No.: WO2018/016213
PCT Pub. Date: Jan. 25, 2018

(65) Prior Publication Data
US 2019/0229279 A1    Jul. 25, 2019

(30) Foreign Application Priority Data
Jul. 20, 2016  (JP) ................................ 2016-142825

(51) Int. Cl.
*B82Y 40/00* (2011.01)
*B82Y 10/00* (2011.01)
(Continued)

(52) U.S. Cl.
CPC ............. *H10K 30/35* (2023.02); *B82Y 10/00* (2013.01); *B82Y 15/00* (2013.01); *B82Y 40/00* (2013.01);
(Continued)

(58) Field of Classification Search
CPC .......... B82Y 10/00; B82Y 15/00; B82Y 30/00
See application file for complete search history.

(56) References Cited

U.S. PATENT DOCUMENTS

| | | |
|---|---|---|
| 9,099,663 B1 | 8/2015 | Chuang et al. |
| 2007/0215856 A1 | 9/2007 | Kwon et al. |

(Continued)

FOREIGN PATENT DOCUMENTS

| | | |
|---|---|---|
| CN | 102159503 A | 8/2011 |
| JP | 2005-213472 | 8/2005 |

(Continued)

OTHER PUBLICATIONS

R. Xie et al., "Formation of High-Quality I-III-VI Semiconductor Nanocrystals by Tuning Relative Reactivity of Cationic Precursors," J. Am. Chem. Soc. 2009, 131, 5691-5697. (Year: 2009).*

(Continued)

*Primary Examiner* — Peter M Albrecht
(74) *Attorney, Agent, or Firm* — Sheridan Ross PC

(57) ABSTRACT

To provide a semiconductor film capable of realizing further enhancement of photoelectric conversion efficiency.
The semiconductor film includes semiconductor nanoparticles and a compound represented by the following general formula (1), in which the compound represented by the general formula (1) is coordinated to the semiconductor nanoparticles.

[Chem. 1]

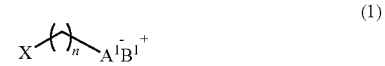

(1)

(In the general formula (1), X represents —SH, —COOH, —NH$_2$, —PO(OH)$_2$, or —SO$_2$(OH), A$^1$ represents —S,
(Continued)

—COO, —PO(OH)O, or —SO$_2$(O), and n is an integer of 1 to 3. B$^1$ represents Li, Na, or K.)

9 Claims, 4 Drawing Sheets

(51) Int. Cl.
*B82Y 15/00* (2011.01)
*B82Y 30/00* (2011.01)
*H10K 30/35* (2023.01)
*H10K 19/20* (2023.01)
*H10K 39/32* (2023.01)

(52) U.S. Cl.
CPC ............ *H10K 19/20* (2023.02); *H10K 39/32* (2023.02); *B82Y 30/00* (2013.01)

(56) References Cited

U.S. PATENT DOCUMENTS

| | | |
|---|---|---|
| 2010/0059721 A1 | 3/2010 | Pickett et al. |
| 2011/0073835 A1 | 3/2011 | Ren et al. |
| 2015/0214400 A1 | 7/2015 | Newman et al. |
| 2015/0372046 A1 | 12/2015 | Kim et al. |
| 2016/0293783 A1 | 10/2016 | Shiomi et al. |
| 2017/0183511 A1* | 6/2017 | Wheeler .............. H01L 31/028 |

FOREIGN PATENT DOCUMENTS

| | | |
|---|---|---|
| JP | 2006-245285 | 9/2006 |
| JP | 2008-514737 | 5/2008 |
| JP | 2011-528624 | 11/2011 |
| JP | 2014-093327 | 5/2014 |
| JP | 2014112623 A | 6/2014 |
| JP | 2014-143397 | 8/2014 |
| JP | 2015-128105 | 7/2015 |
| JP | 2015-176956 | 10/2015 |
| JP | 2016-513361 | 5/2016 |
| TW | 201201373 A | 1/2012 |
| WO | WO 2010/010329 | 1/2010 |
| WO | WO 2015/098048 | 7/2015 |

OTHER PUBLICATIONS

Graham H. Carey, et al., Cleavable Ligands Enable Uniform Close Packing in Colloidal Quantum Dot Solids, ACS Applied Material & Interfaces, Research Article, 2015, 7, pp. 21995-22000.

Jin Young Kim, et al., Single-step fabrication of quantum funnels via centrifugal colloidal casting of nanoparticle films, 2015, 07, 13, Nature Communications | 6:7772 | DOI: 10.1038/ncomms8772 www.nature.com/naturecommunications. pp. 1-9.

Alexander H. IP, et al., Hybrid passivated colloidal quantum dot solids, 2012, 07, 29, Nature Nanotechnology | vol. 7 | Sep. 2012 | www.nature.com/naturenanotechnology, pp. 577-582.

International Search Report prepared by the Japan Patent Office dated Jul. 6, 2017, for International Application No. PCT/JP2017/020973.

Extended European Search Report for European Patent Application No. 17830733.6, dated Jul. 25, 2019, 7 pages.

* cited by examiner

SEMICONDUCTOR FILM AND METHOD OF PRODUCING THE SAME, PHOTOELECTRIC CONVERSION ELEMENT, SOLID-STATE IMAGING ELEMENT AND ELECTRONIC APPARATUS

CROSS REFERENCE TO RELATED APPLICATIONS

This application is a national stage application under 35 U.S.C. 371 and claims the benefit of PCT Application No. PCT/JP2017/020973 having an international filing date of 6 Jun. 2017, which designated the United States, which PCT application claimed the benefit of Japanese Patent Application No. 2016-142825 filed 20 Jul. 2016, the entire disclosures of each of which are incorporated herein by reference.

TECHNICAL FIELD

The present technology relates to a semiconductor film, a method of producing a semiconductor film, a photoelectric conversion element, a solid-state imaging element and an electronic apparatus.

BACKGROUND ART

In recent years, for realizing extra miniaturization and higher image quality in regard of digital cameras and the like, research and development of color imaging devices in which red, blue and green absorption layers are stacked have been under way.

For example, there have been proposed a semiconductor film including aggregates of metal atom-containing semiconductor quantum dots and a specific ligand coordinated to the semiconductor quantum dots, and a method of producing the semiconductor film by use of a ligand longer in molecular chain length than the specific ligand (see PTL 1).

In addition, there have also been proposed, for example, quantum dots obtained by a process in which a halogen and oleylamine are coordinated to quantum dots, and, after film formation, ligand exchange from oleylamine to mercaptopropionic acid (MPA) is conducted (see NPL 1). Further, a film formed by dispersing quantum dots, to which mercaptopropionic acid (MPA) has been coordinated, in dimethyl sulfoxide (DMSO), followed by a dip coating method has been proposed (see NPL 2), and a film formed by coordinating an amide compound to quantum dots, followed by decomposing the amide compound with an acid has been proposed (see NPL 3).

CITATION LIST

Patent Literature

[PTL 1]
JP 2014-112623A

Non Patent Literature

[NPL 1]
NATURE NANOTECHNOLOGY, 2012
[NPL 2]
NATURE COMMUNICATIONS, 2015
[NPL 3]
ACS Appl. Mater. Interfaces 2015, 7, 21995-22000

SUMMARY

Technical Problem

However, according to the technologies proposed by PTL 1 and NPL 1 to 3, further enhancement of photoelectric conversion efficiency may not be achieved.

In view of the foregoing, the present technology has been made in consideration of the above-mentioned circumstances. It is therefore a main object to provide a semiconductor film, a method of producing a semiconductor film, a photoelectric conversion element, a solid-state element and an electronic apparatus which make it possible to realize further enhancement of photoelectric conversion efficiency.

Solution to Problem

The present inventors has made extensive and intensive researches for achieving the above object and as a result, has surprisingly succeeded in drastically enhancing the photoelectric conversion efficiency, thereby coming to complete the present technology.

More specifically, according to the present technology, first, there is provided a semiconductor film including semiconductor nanoparticles and a compound represented by the following general formula (1), in which the compound represented by the general formula (1) is coordinated to the semiconductor nanoparticles.

[Chem. 1]

(1)

In the general formula (1), X represents —SH, —COOH, —NH$_2$, —PO(OH)$_2$, or —SO$_2$(OH), A$^1$ represents —S, —COO, —PO(OH)O, or —SO$_2$(O), and n is an integer of 1 to 3. B$^1$ represents Li, Na, or K.

In addition, according to the present technology, there is provided a semiconductor film obtained by coating a substrate with a dispersion containing semiconductor nanoparticles and a compound represented by the following general formula (2), in which the compound represented by the general formula (2) is coordinated to the semiconductor nanoparticles.

[Chem. 2]

(2)

In the general formula (2), X represents —SH, —COOH, —NH$_2$, —PO(OH)$_2$, or —SO$_2$(OH), A$^1$ represents —S, —COO, —PO(OH)O, or —SO$_2$(O), and n represents an integer of 1 to 3. B$^2$ represents an imidazolium compound, a pyridinium compound, a phosphonium compound, an ammonium compound, or a sulfonium compound.

The semiconductor nanoparticles included in the semiconductor film according to the present technology may selectively absorb at least light in a visible region.

The semiconductor nanoparticles included in the semiconductor film according to the present technology may selectively absorb at least light in an infrared region.

Further, according to the present technology, there is provided a method of producing a semiconductor film, the method including coating a substrate with a dispersion containing semiconductor nanoparticles and a compound represented by the following general formula (2), in which the compound represented by the general formula (2) is coordinated to the semiconductor nanoparticles.

[Chem. 3]

(2)

In the general formula (2), X represents —SH, —COOH, —NH$_2$, —PO(OH)$_2$, or —SO$_2$(OH), A$^1$ represents —S, —COO, —PO(OH)O, or —SO$_2$(O), and n represents an integer of 1 to 3. B$^2$ represents an imidazolium compound, a pyridinium compound, a phosphonium compound, an ammonium compound, or a sulfonium compound.

In the method of producing a semiconductor film according to the present technology, the semiconductor nanoparticles may selectively absorb at least light in a visible region.

In the method of producing a semiconductor film according to the present technology, the semiconductor nanoparticles may selectively absorb at least light in an infrared region.

According to the present technology, there is provided a photoelectric conversion element including a semiconductor film according to the present technology, and a first electrode and a second electrode which are disposed to face each other, in which the semiconductor film is disposed between the first electrode and the second electrode.

Besides, according to the present technology, there is provided a solid-state imaging element in which at least a photoelectric conversion element according to the present technology and a semiconductor substrate are stacked for each of a plurality of pixels arranged in a one-dimensional manner or a two-dimensional manner.

Further, according to the present technology, there is provided an electronic apparatus including a solid-state imaging element according to the present technology.

Advantageous Effect of Invention

In accordance with the present technology, image quality and reliability can be enhanced. Note that the effect described here is not necessarily limitative, and any of the effects described in the present technology may be provided.

DESCRIPTION OF EMBODIMENTS

Figure 1:
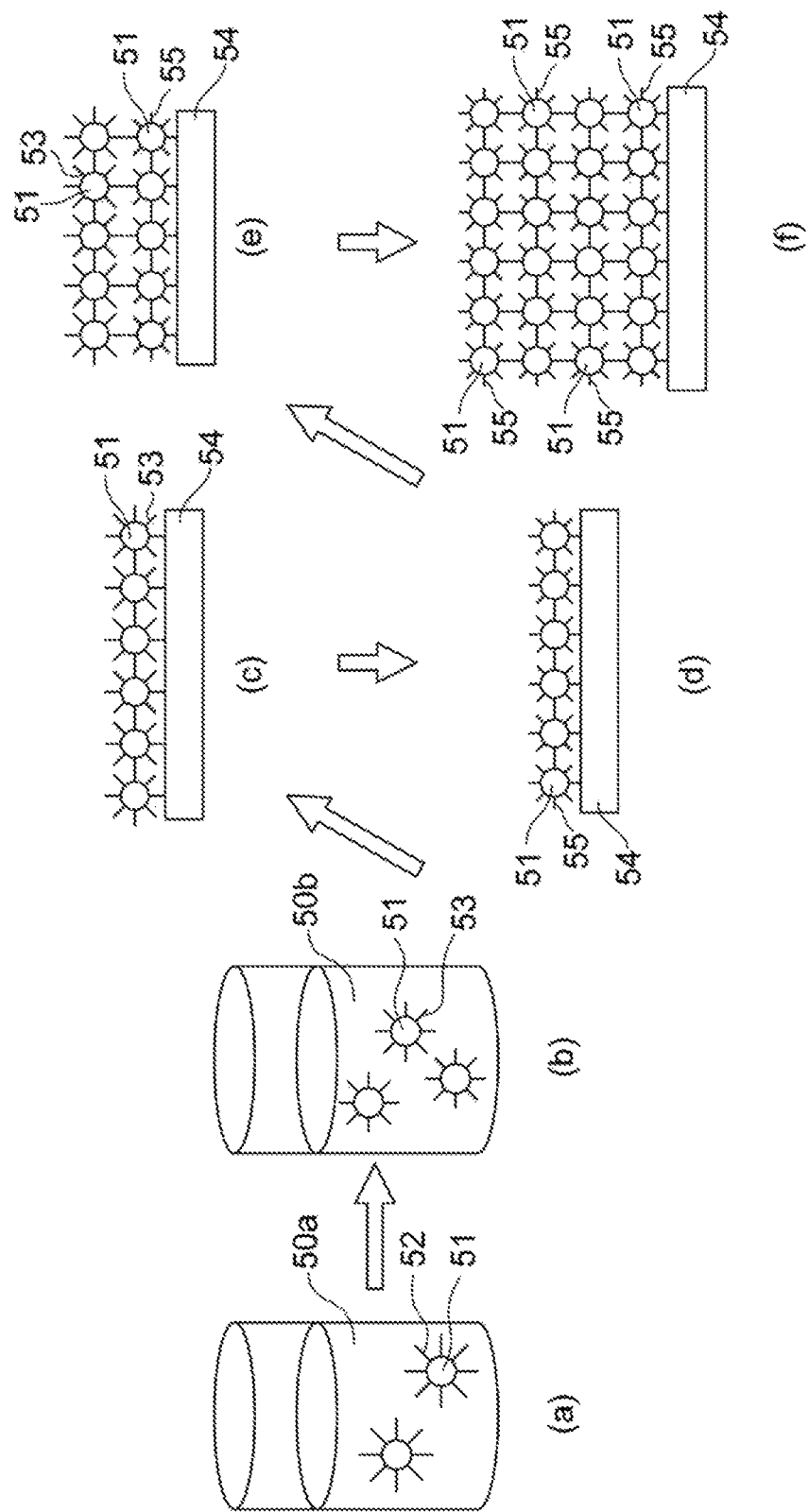
FIG. 1 is figures illustrating schematically an example of a method of producing a semiconductor film according to a third embodiment to which the present technology is applied.

Preferred modes for carrying out the present technology will be described below. The embodiments described below are examples of typical embodiments of the present technology, by which the scope of the present technology is not to be construed narrowly.

Note that the description will be made in the following order.

1. Outline of Present Technology
2. First Embodiment (Example of Semiconductor Film)
   2-1. Semiconductor film
   2-2. Semiconductor nanoparticles
   2-3. Compound represented by general formula (1)
3. Second Embodiment (Example of Semiconductor Film)
   3-1. Semiconductor film
   3-2. Dispersion
   3-3. Compound represented by general formula (2)
4. Third Embodiment (Example of Method of Producing Semiconductor Film)
   4-1. Method of producing semiconductor film
   4-2. Film formation (Coating)
   4-3. Specific example of method of producing semiconductor film
5. Fourth Embodiment (Example of Photoelectric Conversion Element)
   5-1. Photoelectric conversion element
   5-2. First electrode
   5-3. Second electrode
   5-4. Electron transport layer
   5-5. Hole transport layer
   5-6. Substrate for photoelectric conversion element
   5-7. Method of producing photoelectric conversion element
6. Fifth Embodiment (Example of Solid-State Imaging Element)
   6-1. Solid-state imaging element
   6-2. Back illumination type solid-state imaging element
   6-3. Front illumination type solid-state imaging element
7. Sixth Embodiment (Example of Electronic Apparatus)
8. Use Examples of Solid-State Imaging Element to Which Present Technology Is Applied
9. Seventh Embodiment (Example of Light Emitting Device)

1. Outline of Present Technology

First, an outline of the present technology will be described.

In order to realize enhanced performance and diversified functions of a color imaging device mounted on a digital camera or the like, a progress in the technology concerning a photoelectric conversion element or a light emitting device in which semiconductor nanoparticles are used is essential.

For example, in production of a semiconductor nanoparticle layer including semiconductor nanoparticles, there is a technology in which a long-chain ligand is coordinated to semiconductor nanoparticles, to thereby disperse the semiconductor nanoparticles in an organic solvent, a substrate is coated with the resulting dispersion to form a film, and thereafter ligand exchange to a short-chain ligand is performed, to thereby reduce a distance between the semiconductor nanoparticles, thereby enhancing carrier mobility. A semiconductor film obtained by this technology, however, is insufficient in surface coating, which leads to surface defects, and, through an intermediate level arising from the surface defects, electrons and holes generated by photoelectric conversion would be recombined, resulting in deactivation.

For the purpose of enhancing surface coverage for the semiconductor nanoparticles, there is a method in which a halogen atom is preliminarily coordinated to crystal sites where coordination of the short-chain ligand is hardly accomplished, and the surface coverage is thereby enhanced. In addition, there are a method in which nanoparticles to which 3-mercaptopropionic acid as a short-chain ligand is preliminarily coordinated are dispersed in dimethyl sulfoxide (DMSO) and dip coating is conducted, and a method in which a functional group having an amide group is coordinated and after film formation, the ligand is hydrolyzed by an acid to convert the ligand into a short-chain ligand.

These three methods, however, have a problem that a desirable high photoelectric conversion efficiency cannot be obtained, since a coordination rate is low, or suitability for film formation is poor due to bad volatility of the dispersant (dimethyl sulfoxide (DMSO)) and difficulty in removing the dispersant, or dispersion stability is poor due to the hydrolysis by an acid. In addition, where semiconductor films obtained respectively by these three methods are applied to light emitting devices, there may arise a problem that a high light emission efficiency also cannot be obtained.

The present technology has been completed as a result of the present inventors' extensive and intensive investigations of the above-mentioned problems. The present technology relates to a semiconductor film, a method of producing a semiconductor film, a photoelectric conversion element, a solid-state imaging element, and an electronic apparatus. In addition, the present technology may be applied to a light emitting device. For improving the photoelectric conversion efficiency of a photoelectric conversion element and the light emission efficiency of a light emitting device which have been problems, the present technology relates to a semiconductor film containing semiconductor nanoparticles having undergone ligand exchange to a short-chain ligand which is a compound represented by the general formula (1) described later through a process in which a film is formed using a dispersion of semiconductor nanoparticles having a compound represented by the general formula (2) described later, followed by ion exchange. Besides, by providing a photoelectric conversion element and a light emitting device including the semiconductor film, the present technology solves the above-mentioned problems. Further, by providing a solid-state imaging element which includes the photoelectric conversion element and which has a high photoelectric conversion efficiency and a display apparatus which includes the light emitting device and which has a high light emission efficiency, the present technology also solves the above-mentioned problems.

2. First Embodiment (Example of Semiconductor Film)

[2-1. Semiconductor Film]

A semiconductor film according to a first embodiment of the present technology is a semiconductor film including semiconductor nanoparticles and a compound represented by the following general formula (1), in which the compound represented by the general formula (1) is coordinated to the semiconductor nanoparticles.

[Chem. 4]

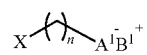

(1)

In the general formula (1), X represents —SH, —COOH, —NH$_2$, —PO(OH)$_2$, or —SO$_2$(OH), $A^1$ represents —S, —COO, —PO(OH)O, or —SO$_2$(O), and n is an integer of 1 to 3. $B^1$ represents Li, Na, or K.

The semiconductor film according to the first embodiment of the present technology can reduce an intermediate level or levels arising from surface defects of semiconductor nanoparticles, and because of containing the semiconductor nanoparticles having high carrier mobility, can restrain recombination of electrons and holes, and can reduce a dark current.

[2-2. Semiconductor Nanoparticles]

The semiconductor nanoparticles contained in the semiconductor film according to the first embodiment of the present technology may be arbitrary semiconductor nanoparticles, and include, for example, at least one of TiO$_2$, ZnO, WO$_3$, NiO, MoO$_3$, CuO, Ga$_2$O$_3$, SrTiO$_3$, SnO$_2$, InSnOx, Nb$_2$O$_3$, MnO$_2$, V$_2$O$_3$, CrO, CuInSe$_2$, CuInS$_2$, AgInS$_2$, Si, PbS, PbSe, PbTe, CdS, CdSe, CdTe, Fe$_2$O$_3$, GaAs, GaP, InP, InAs, Ge, In$_2$S$_3$, Bi$_2$S$_3$, ZnSe, ZnTe, ZnS, and the like. A particle diameter of the semiconductor nanoparticle is an arbitrary size and is preferably 2 to 20 nm. A shape of the semiconductor nanoparticle may be a sphere, an ellipsoid, or a triangular prism or the like.

It is preferable that the semiconductor nanoparticles selectively absorb at least light in a visible region. Examples of the semiconductor nanoparticles for red light include PbSe, CdTe, PbS, Si, PbTe, CdSe, CuInSe$_2$, CuInS$_2$, AgInS$_2$, MnO$_2$, V$_2$O$_3$, CrO, GaAs, Fe$_2$O$_3$, InP, InAs, Ge, Bi$_2$S$_3$, CuO, and the like. Examples of the semiconductor nanoparticles for green light include CdS, GaP, ZnTe, and the like. Examples of the semiconductor nanoparticles for blue light include WO$_3$, ZnSe, In$_2$S$_3$, and the like. In addition, the semiconductor nanoparticles for red light can be shortened in wavelength at an absorption end by reducing the particle size, and therefore, the semiconductor nanoparticles for red light which are reduced in particle size can be used as semiconductor nanoparticles for green light and those for blue light.

In addition, it is preferable that the semiconductor nanoparticles selectively absorb at least light in an infrared region.

The semiconductor nanoparticles may selectively absorb at least light in an ultraviolet region.

[2-3. Compound Represented by General Formula (1)]

The compound contained in the semiconductor film according to the first embodiment of the present technology is represented by the following general formula (1). The compound represented by the following general formula (1) may be selected from the viewpoint of small steric hindrance at the time of coordination to the semiconductor nanoparticles.

[Chem. 5]

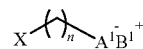

(1)

In the general formula (1), X represents —SH, —COOH, —NH$_2$, —PO(OH)$_2$, or —SO$_2$(OH), A$^1$ represents —S, —COO, —PO(OH)O, or —SO$_2$(O), and n is an integer of 1 to 3. It is preferable that n is 1. B$^1$ represents Li, Na, or K.

The compound represented by the general formula (1) is coordinated to the semiconductor nanoparticles as a short ligand. Since an ionic radius of B$^{1+}$ ion which is an alkali metal (Li, Na, or K) ion is smaller than an ionic radius of B$^{2+}$ ion which is a cation of an organic compound (for example, an imidazolium compound, a pyridinium compound, a phosphonium compound, an ammonium compound, or a sulfonium compound), the compound represented by the general formula (1) is a shorter ligand as compared to the ligand including the cation (B$^{2+}$) of the organic compound (the compound represented by the general formula (2)). Note that all the compound represented by the general formula (1) contained in the semiconductor film may be coordinated to the semiconductor nanoparticles, or part of the compound represented by the general formula (1) contained in the semiconductor film may be coordinated to the semiconductor nanoparticles.

The compound represented by the general formula (1) is a short ligand which is coordinated to the semiconductor nanoparticles as aforementioned, and by the coordination of the compound represented by the general formula (1) to the semiconductor nanoparticles, an inter-particle distance between the semiconductor nanoparticles can be shortened, and carrier mobility can be enhanced. In addition, since the compound represented by the general formula (1) is an alkali metal salt, a decomposition temperature of the ligand can be improved.

3. Second Embodiment (Example of Semiconductor Film)

[3-1. Semiconductor Film]

A semiconductor film according to a second embodiment of the present technology is obtained by coating a substrate with a dispersion containing semiconductor nanoparticles and a compound represented by the following general formula (2), and the compound represented by the general formula (2) is coordinated to the semiconductor nanoparticles. Note that the semiconductor nanoparticles contained in the semiconductor film according to the second embodiment of the present technology are as mentioned above, and therefore, description thereof is omitted here.

[Chem. 6]

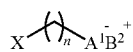

(2)

In the general formula (2), X represents —SH, —COOH, —NH$_2$, —PO(OH)$_2$, or —SO$_2$(OH), A$^1$ represents —S, —COO, —PO(OH)O, or —SO$_2$(O), and n represents an integer of 1 to 3. B$^2$ represents an imidazolium compound, a pyridinium compound, a phosphonium compound, an ammonium compound, or a sulfonium compound.

The semiconductor film according to the second embodiment of the present technology can reduce an intermediate level or levels arising from surface defects of the semiconductor nanoparticles, and because of containing the semiconductor nanoparticles having high carrier mobility, can restrain recombination of electrons and holes, and can reduce a dark current.

[3-2. Dispersion]

The dispersion used for obtaining the semiconductor film according to the second embodiment of the present technology contains the semiconductor nanoparticles and the compound represented by the general formula (2). The dispersion can be obtained by dispersing the semiconductor nanoparticles and the compound represented by the general formula (2) in a solvent. The solvent may be a polar solvent, or a low polar solvent, or a nonpolar solvent, but preferably, it is a polar solvent. When the semiconductor nanoparticles to which the compound represented by the general formula (2) is coordinated are dispersed in a polar solvent, dispersibility is enhanced. The polar solvent may be an arbitrary one, and examples thereof include methanol, ethanol, 1-propanol, 2-propanol, 1-butanol, dimethyl formamide, dimethyl sulfoxide, N-methyl formamide, and the like.

The semiconductor nanoparticles are the same as the semiconductor nanoparticles contained in the semiconductor film in the first embodiment of the present technology, and therefore, description thereof is omitted here. The compound represented by the general formula (2) will be described below.

[3-3. Compound Represented by General Formula (2)]

The compound contained in the semiconductor film in the first embodiment of the present technology is represented by the following general formula (2).

[Chem. 7]

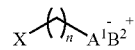

(2)

In the general formula (2), X represents —SH, —COOH, —NH$_2$, —PO(OH)$_2$, or —SO$_2$(OH), A$^1$ represents —S, —COO, —PO(OH)O, or —SO$_2$(O), and n represents an integer of 1 to 3. It is preferable that n is 1. B$^2$ represents an imidazolium compound, a pyridinium compound, a phosphonium compound, an ammonium compound, or a sulfonium compound.

B$^2$ may be selected in consideration of solubility or dispersibility in solvents, dissociability (PKa, PKb, or the like) to B$^{2+}$ (cation), and the like. Examples of the cation (B$^{2+}$) of the imidazolium compound include 1-methylimidazolium cation, 1,3-dimethylimidazolium, 1,2-dimethylimidazolium, and 1-butylimidazolium. Examples of the cation (B$^{2+}$) of the pyridinium compound include 1-methylpyridinium, and 1-ethylpyridinium. Examples of the cation (B$^{2+}$) of the ammonium compound include tetrabutylammonium ion. Examples of the cation (B$^{2+}$) of the sulfonium compound include triethyl sulfonium.

It is considered that, when X in the compound represented by the general formula (2) is coordinate-bonded to the semiconductor nanoparticles, B$^{2+}$ is located at a terminal end (a part substantially opposite, on a molecular structure basis, to a coordinate bond part) in the compound represented by the general formula (2). Since B$^{2+}$ is a cation of an organic compound, the semiconductor nanoparticles to which the compound represented by the general formula (2) is coordinated are easily dispersed in solvents, particularly in polar solvents, so that dispersibility is enhanced, and at the same time, the coordination rate of the compound represented by the general formula (2) to the semiconductor nanoparticles in a dispersed state can be enhanced, and surface defects of the semiconductor nanoparticles can be reduced.

A film is formed by coating a substrate with the above-mentioned dispersion; while the distance between the particles is long and it obstructs conduction of carriers in this state, ion exchange from $B^{2+}$ in the compound represented by the general formula (2) to $B^{1+}$ in the compound represented by the general formula (A) makes it possible to shorten the inter-particle distance between the semiconductor nanoparticles, and to achieve a high carrier mobility.

Since the part ion-exchanged by the ion exchange is from $B^{2+}$ which is a terminal end of a ligand to $B^{1+}$ which is a terminal end of a short ligand, a reduction of surface defects is small even when a change from a dispersion state to a film state is made. Since the ligand exchange from a long ligand to a short ligand in the film state involves exchange of the whole ligands in the film state, a coordination rate is low, and reduction of surface defects is large, so that a surface state in an initial state cannot be maintained. The exchange to the alkali metal ion which is $B^{1+}$ in the compound represented by the general formula (A) by the ion exchange insolubilizes the film (inclusive of an already layered film) with respect to the solvent of the dispersion, whereby suitability to film formation (layering) by the Layer-by-Layer (LBL) method described later can be enhanced.

In addition, change to the alkali metal such as Na by the ion exchange can enhance thermal resistance. In a case where an ordinary method is used, when any of Hs in HS—$CH_2CH_2$—COOH is replaced by Na, solubility is so poor that change to the short ligand and Na salt cannot be achieved by a single operation, and a two-stage method of once performing ligand exchange to a mercaptopropionic acid (MPA) ligand and then performing ion exchange is adopted. In other words, the ion exchange has an excellent effect that the process can be simplified.

[3-4. Substrate]

The substrate to be coated with the above-mentioned dispersion is a concept including an electrode, and it may be a monolayer structure in which the substrate itself is an electrode, or may be a layered structure in which an electrode is layered on a support substrate of an inorganic material, a resin, or the like. In addition, the substrate may be a layered structure in which an electrode and an insulating film are layered on a support substrate of an inorganic material, a resin, or the like. A shape, a size, and a thickness of the substrate are not particularly limited, and can be selected, as required, according to a viewpoint of suitability for producing, a viewpoint of purpose of use, etc.

4. Third Embodiment (Example of Method of Producing Semiconductor Film)

[4-1. Method of Producing Semiconductor Film]

A method of producing a semiconductor film in a third embodiment of the present technology is a producing method including coating a substrate with a dispersion containing semiconductor nanoparticles and a compound represented by the following general formula (2), in which the compound represented by the general formula (2) is coordinated to the semiconductor nanoparticles. Note that the semiconductor nanoparticles and the compound represented by the general formula (2) which are used in the method of manufacturing the semiconductor film in the third embodiment of the present technology are as mentioned above, and descriptions thereof are omitted here.

[Chem. 8]

(2)

In the general formula (2), X represents —SH, —COOH, —$NH_2$, —$PO(OH)_2$, or —$SO_2(OH)$, $A^1$ represents —S, —COO, —PO(OH)O, or —$SO_2(O)$, and n represents an integer of 1 to 3. It is preferable that n is 1. $B^2$ represents an imidazolium compound, a pyridinium compound, a phosphonium compound, an ammonium compound, or a sulfonium compound.

[4-2. Film Formation (Coating)]

Examples of a film forming (coating) method for the semiconductor film include a wet coating method. Here, specific examples of the coating method include a spin coating method; an immersion method; a casting method; various printing method such as a screen printing method, an ink jet printing method, an offset printing method, and a gravure printing method; a stamping method; a spraying method; and various coating methods such as an air doctor coater method, a blade coater method, a rod coater method, a knife coater method, a squeeze coater method, a reverse roll coater method, a transfer roll coater method, a gravure coater method, a kiss coater method, a cast coater method, a spray coater method, a slit orifice coater method, and a calendar coater method.

[4-3. Specific Example of Method of Producing Semiconductor Film]

An example of the method of producing the semiconductor film will be described referring to FIG. 1. The method of producing the semiconductor film illustrated in FIG. 1 is a so-called Layer-by-Layer (LBL) method. As illustrated in FIG. 1, a semiconductor film is produced in the order of (a)→(b)→(c)→[(d)→(e)]→(f). Note that, as described later, [(d)→(e)] may be repeated according to the film thickness of the semiconductor film (the number of times of layering).

FIG. 1(a) is a diagram illustrating a dispersion 50a prepared by dispersing semiconductor nanoparticles 51 to which a long ligand 52 such as oleylamine and oleic acid has been coordinated, in a nonpolar or low polar solvent (for example, octane).

Subsequently, a solution prepared by dissolving a compound represented by the general formula (2) (for example, tetrabutylammonium 3-mercaptopropionate) in a polar solvent (for example, methanol) is added to the dispersion 50a. As illustrated in FIG. 1(b), ligand exchange from a long ligand 52 to a ligand 53 which is the compound represented by the general formula (2) (for example, tetrabutylammonium 3-mercaptopropionate) occurs, whereby a dispersion 50b in which the semiconductor nanoparticles 51 to which the ligand 53 is coordinated is dispersed in the polar solvent (for example, methanol) is prepared. In the state of the dispersion, the coordination rate of the ligand 53 to the semiconductor nanoparticles 51 can be enhanced.

Next, as illustrated in FIG. 1(c), an electrode (substrate) 54 (for example, $TiO_2$) is coated with a layer of the dispersion 50b by spin coating, to form on the electrode (substrate) 54 a film containing the semiconductor nanoparticles 51 to which the ligand 53 as the compound represented by the general formula (2) (for example, tetrabutylammonium 3-mercaptopropionate) is coordinated.

Subsequently, the organic cation $B^{2+}$ (for example, tetrabutylammonium cation) in the compound represented by the general formula (2) is ion-exchanged to an alkali metal ion (for example, Na$^+$) by an ion exchange method. As illustrated in FIG. 1(d), a film containing the semiconductor nanoparticles 51 to which a short ligand 55 as a compound represented by the general formula (1) (for example, sodium 3-mercaptopropionate) is coordinated is formed on the electrode (substrate) 54. actions and effects offered by the ion exchange are as mentioned above.

Next, by use of the dispersion 50b, a second layer is formed by spin coating (FIG. 1(e)), and further, as illustrated in FIG. 1(d), ion exchange is performed again. Specifically, by repeating FIG. 1(d)→FIG. 1(e), layering is repeated, whereby a semiconductor film having a desired film thickness is produced (FIG. 1(f)).

5. Fourth Embodiment (Example of Photoelectric Conversion Element)

[5-1. Photoelectric Conversion Element]

A photoelectric conversion element in a fourth embodiment of the present technology is a photoelectric conversion element including the semiconductor film of the first embodiment or the semiconductor film of the second embodiment of the present technology, and a first electrode and a second electrode which are disposed to face each other, in which the semiconductor film is disposed between the first electrode and the second electrode. In this case, the semiconductor film acts as a photoelectric conversion film (photoelectric conversion layer). As will be described later, an electron transport layer may be disposed between the first electrode and the semiconductor film, and a hole transport layer may be disposed between the second electrode and the semiconductor film. Note that the semiconductor film of the first embodiment or the semiconductor film of the second embodiment that is provided in the photoelectric conversion element of the fourth embodiment of the present technology is as mentioned above, and therefore, description thereof is omitted here.

The photoelectric conversion element of the fourth embodiment of the present technology has the semiconductor film of the first embodiment or the semiconductor film of the second embodiment, and therefore, an excellent photoelectric conversion efficiency can be realized.

[5-2. First Electrode]

The first electrode provided in the photoelectric conversion element of the fourth embodiment of the present technology takes out a signal charge (charge) generated in the semiconductor film. The first electrode includes, for example, a light-transmitting conductive material, specifically, ITO (Indium Tin Oxide). The first electrode may include, for example, a tin oxide ($SnO_2$) material or a zinc oxide (ZnO) material. The tin oxide material is a material obtained by adding a dopant to tin oxide. The zinc oxide material is, for example, aluminum zinc oxide (AZO) obtained by adding aluminum (Al) as a dopant to zinc oxide, gallium zinc oxide (GZO) obtained by adding gallium (Ga) as a dopant to zinc oxide, indium zinc oxide (IZO) obtained by adding indium (In) as a dopant to zinc oxide, or the like. Other than these, it is also possible to use IGZO, CuI, InSbO$_4$, ZnMgO, CuInO$_2$, MgIn$_2$O$_4$, CdO, ZnSnO$_3$, and the like. A thickness (a thickness in a layering direction; hereinafter referred to simply as thickness) of the first electrode may be an arbitrary thickness and is, for example, 50 to 500 nm.

[5-3. Second Electrode]

The second electrode provided in the photoelectric conversion element of the fourth embodiment of the present technology is for taking out holes. The second electrode may include a conductive material such as, for example, gold (Au), silver (Ag), copper (Cu), and aluminum (Al). Like the first electrode, the second electrode may include a light-transmitting conductive material. The thickness of the second electrode may be an arbitrary thickness and is, for example, 0.5 to 100 nm.

[5-4. Electron Transport Layer]

The electron transport layer that may be provided in the photoelectric conversion element of the fourth embodiment of the present technology accelerates supply of electrons generated in the semiconductor film to the first electrode and may include, for example, titanium oxide ($TiO_2$), zinc oxide (ZnO), or the like. Titanium oxide and zinc oxide may be layered on each other to compose the electron transport layer. A thickness of the electron transport layer may be an arbitrary thickness, and is, for example, 0.1 to 1,000 nm, preferably, 0.5 to 200 nm.

[5-5. Hole Transport Layer]

The hole transport layer that may be provided in the photoelectric conversion element of the fourth embodiment of the present technology accelerates supply of holes generated in the semiconductor film to the second electrode and may include, for example, molybdenum oxide ($MoO_3$), nickel oxide (NiO), vanadium oxide ($V_2O$), or the like. The hole transport layer may include an organic material such as PEDOT (Poly(3,4-ethylenedioxythiophene)), or TPD (N,N'-Bis(3-methylphenyl)-N,N'-diphenylbenzidine). A thickness of the hole transport layer may be an arbitrary thickness and is, for example, 0.5 to 100 nm.

[5-6. Substrate for Photoelectric Conversion Element]

The photoelectric conversion element may be formed on a substrate. Here, examples of the substrate include organic polymers (having a form of a polymer material such as a plastic film or plastic sheet, or a plastic substrate including a polymer material and being flexible) exemplified by polymethyl methacrylate (PMMA), polyvinyl alcohol (PVA), polyvinyl phenol (PVP), polyether sulfone (PES), polyimides, polycarbonate (PC), polyethylene terephthalate (PET), and polyethylene naphthalate (PEN). When the substrate including such a flexible polymer material is used, incorporation or uniting of an imaging element into or with an electronic apparatus having, for example, a curved surface can be achieved. Alternatively, examples of the substrate include various glass substrates, various glass substrates formed with an insulating film on a front surface thereof, a quartz substrate, a quartz substrate formed with an insulating film on a front surface thereof, a silicon semiconductor substrate, and a metallic substrate of various alloys or various metals such as a stainless steel formed with an insulating film on a front surface thereof. Note that examples of the insulating film include silicon oxide materials (for example, SiO$_X$ or spin-on-glass (SOG)); silicon nitride (SiN$_Y$); silicon oxynitride (SiON); aluminum oxide (Al$_2$O$_3$); metallic oxides and metallic salts. In addition, an insulating film of an organic material can also be formed. Examples of the organic insulating film include polyphenol materials, polyvinyl phenol materials, polyimide materials, polyamide materials, polyamide-imide materials, fluoropolymer materials, borazine-Si polymer materials, and truxene materials, for which lithography can be used. Further, conductive substrates (substrates including a metal such as gold and aluminum, substrates including highly oriented graphite) formed with an insulating film on a front surface thereof can also be used.

While the front surface of the substrate is desirably smooth, it may have such a degree of roughness as not to adversely affect the characteristics of the organic photoelectric conversion layer. Adhesion between the first electrode and the substrate or adhesion between the second electrode and the substrate may be enhanced by formation of a silanol derivative on the front surface of the substrate by a silane coupling method, formation of a thin film including a thiol derivative, a carboxylic acid derivative, a phosphoric acid derivative, or the like by a SAM method or the like, or formation of a thin film formed of an insulating metallic salt or metal complex by a CVD method or the like.

[5-7. Method of Producing Photoelectric Conversion Element]

A method of producing the photoelectric conversion element of the fourth embodiment of the present technology will be described. Here, a case where the photoelectric conversion element of the fourth embodiment of the present technology has an electron transport layer and a hole transport layer will be described.

First, a first electrode is formed. Note that, in a case where the photoelectric conversion element is formed on the substrate described above, the first electrode can be formed on the substrate for the photoelectric conversion element. The first electrode is formed, for example, by forming an ITO film by sputtering, and then performing dry etching or wet etching of the ITO film with patterning by a photolithographic technique.

Next, an electron transport layer including, for example, titanium oxide is provided on the first electrode, followed by forming the semiconductor film. The semiconductor film is formed by applying a relevant material to the electron transport layer by a wet film forming method, followed by a heat treatment. Examples of the wet film forming method include a spin coating method, an immersion method, a casting method, various printing method such as a screen printing method, an ink jet printing method, an offset printing method, and a gravure printing method, a stamping method, a spraying method, and various coating methods such as an air doctor coater method, a blade coater method, a rod coater method, a knife coater method, a squeeze coater method, a reverse roll coater method, a transfer roll coater method, a gravure coater method, a kiss coater method, a cast coater method, a spray coater method, a slit orifice coater method, and a calendar coater method. The heat treatment is performed in air, in a nitrogen ($N_2$) atmosphere or in an argon (Ar) atmosphere at, for example, 100° C. for 30 minutes.

After the semiconductor film is provided, a film of, for example, molybdenum oxide or nickel oxide is formed to form the hole transport layer. On the hole transport layer, a conductive film is formed by a vacuum deposition method to form the second electrode, thereby producing the photoelectric conversion element.

6. Fifth Embodiment (Example of Solid-State Imaging Element

[6-1. Solid-State Imaging Element]

A solid-state imaging element in a fifth embodiment of the present technology is a solid-state imaging element in which at least the photoelectric conversion element of the fourth embodiment of the present technology and a semiconductor substrate are layered for each of a plurality of pixels arranged in a one-dimensional manner or a two-dimensional manner. Examples of the solid-state imaging element of the fifth embodiment of the present technology include a back illumination type solid-state imaging element and a front illumination type solid-state imaging element. First, the back illumination type solid-state imaging element will be described. Note that the photoelectric conversion element of the fourth embodiment that is provided in the solid-state imaging element of the fifth embodiment of the present technology is as mentioned above, and therefore, description thereof is omitted here.

[6-2. Back Illumination Type Solid-State Imaging Element]

Figure 2:
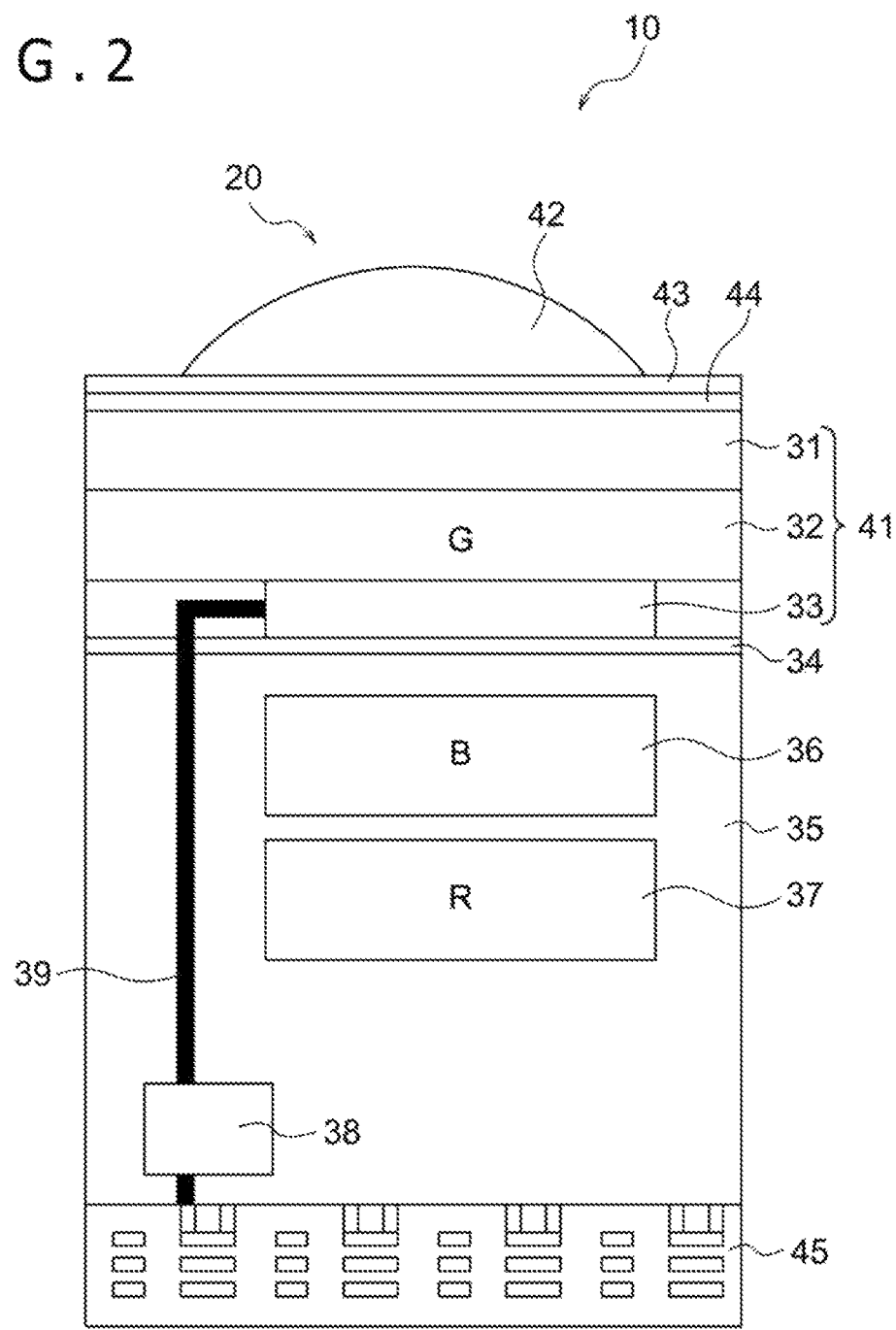
FIG. 2 is a cross-sectional view illustrating a configuration example of a solid-state imaging element according to a fifth embodiment to which the present technology is applied.

An example of the back illumination type solid-state imaging element will be described with reference to FIG. 2. FIG. 2 is a cross-sectional view illustrating a configuration example of one pixel 20 of a back illumination type solid-state imaging element 10.

The pixel 20 includes one photoelectric conversion element 41 as well as a photodiode 36 and a photodiode 37, both having a pn junction, which are layered in a depth direction, in one pixel. The pixel 20 has a semiconductor substrate (silicon substrate) 35 in which the photodiode 36 and the photodiode 37 are formed. A light receiving surface on which light is incident is formed on a back surface side of the semiconductor substrate 35 (an upper side of the semiconductor substrate 35 in FIG. 2), and a circuit including a reading circuit is formed on a front surface side of the semiconductor substrate 35. Thus, in the pixel 2, the light receiving surface on the back surface side of the substrate 35 and the circuit formation surface formed on the substrate front surface side opposite to the light receiving surface are provided. The semiconductor substrate 35 may include a semiconductor substrate of a first conductivity type, for example, n-type.

In the semiconductor substrate 35, two inorganic photoelectric conversion portions having a pn junction, namely, a first photodiode 36 and a second photodiode 37 are formed in the manner of being layered in a depth direction from the back surface side. In the semiconductor substrate 35, the first photodiode 36 and the second photodiode 37 are formed in the depth direction (the downward direction in the figure) from the back surface side. In FIG. 2, the first photodiode 36 is for blue color (B), and the second photodiode 37 is for red color (R).

On an upper portion of the back surface of the semiconductor substrate 35 in a region where the first photodiode 36 and the second photodiode 37 are formed, a photoelectric conversion element 41 for a first color having a configuration in which a semiconductor film (photoelectric conversion layer) 32 has its upper and lower surfaces sandwiched by a second electrode (upper electrode) 31 and a first electrode (lower electrode) 33 is layered. Note that, while not illustrated, the photoelectric conversion element 41 may include an electron transport layer and a hole transport layer. In the example of the back illumination type solid-state imaging element illustrated in FIG. 2, the photoelectric conversion element 41 is for green color (G). The second electrode (upper electrode) 31 and the first electrode (lower electrode) 33 may include a transparent conductive film such as, for example, an indium tin oxide film and an indium zinc oxide film.

As a combination of colors, in the example of the back illumination type solid-state imaging element illustrated in FIG. 2, the photoelectric conversion element 41 is for green color, the first photodiode 36 is for blue color, and the second photodiode 37 is for red color, but other combination of colors can also be adopted. For example, the photoelectric conversion element 41 may be set for red color or blue color, and the first photodiode 36 and the second photodiode 37 may be set for other corresponding colors. In this case, depth directional positions of the first photodiode 36 and the second photodiode 37 are set according to the colors.

In addition, three photoelectric conversion elements consisting of a photoelectric conversion element 41B for blue color, a photoelectric conversion element 41G for green color, and a photoelectric conversion element 41R for red color may be applied to the solid-state imaging element (the back illumination type solid-state imaging element and the front illumination type solid-state imaging element) of the fifth embodiment of the present technology, without using the first photodiode 36 and the second photodiode 37. As the photoelectric conversion element 41B for photoelectric conversion in regard of blue wavelength light, organic photoelectric conversion materials including coumarin dyes, tris (8-hydroxyquinoline)aluminum (Alq3), merocyanine dyes, and the like can be used. As the photoelectric conversion element 41G for photoelectric conversion in regard of green wavelength light, for example, organic photoelectric conversion materials including rhodamine dyes, merocyanine dyes, quinacridone, and the like can be used. As the photoelectric conversion element 41R for photoelectric conversion in regard of red wavelength light, organic photoelectric conversion materials including phthalocyanine dyes can be used.

Further, a photoelectric conversion element 41UV for ultraviolet light and/or a photoelectric conversion element 41IR for infrared light may be applied to the solid-state imaging element (the back illumination type solid-state imaging element and the front illumination type solid-state imaging element) of the fifth embodiment of the present technology, in addition to the photoelectric conversion element 41B for blue color, the photoelectric conversion element 41G for green color and the photoelectric conversion element 41R for red color. With the photoelectric conversion element 41UV for ultraviolet light and/or the photoelectric conversion element 41IR for infrared light provided, it is possible to detect lights of wavelengths other than the visible region.

In the photoelectric conversion element 41, the first electrode (lower electrode) 33 is formed, and an insulating film 34 for insulation of the first electrode (lower electrode) 33 is formed. Then, the semiconductor film (photoelectric conversion layer) 32 and the second electrode (upper electrode) 31 thereon are formed on the first electrode (lower electrode) 33.

In one pixel 2, a wiring 39 connected to the first electrode (lower electrode) 33 and a wiring (not illustrated) connected to the second electrode (upper electrode) 31 are formed. The wiring 39 and the wiring connected to the second electrode (upper electrode) 31 can be formed with a tungsten (W) plug having an $SiO_2$ or SiN insulating layer in the periphery thereof or a semiconductor layer by ion implantation, or the like, for restraining short-circuiting with Si, for example. In the example of the back illumination type solid-state imaging element illustrated in FIG. 2, the signal charge is electrons, and therefore, the wiring 39 is an n-type semiconductor layer, in the case of being formed with a semiconductor layer by ion implantation. The second electrode (upper electrode) 31 is for drawing out holes, and therefore, a p-type can be used therefor.

In this example, an n-type region 38 for charge accumulation is formed on the front surface side of the semiconductor substrate 35. This n-type region 38 functions as a floating diffusion portion for the photoelectric conversion element 41.

As the insulating film 34 on the back surface of the semiconductor substrate 35, a film having a negative fixed charge can be used. As the film having a negative fixed charge, a hafnium oxide film can be used, for example. In other words, the insulating film 34 may be formed in a three-layer structure in which a silicon oxide film, a hafnium oxide film and a silicon oxide film are sequentially formed from the back surface side.

A wiring layer 45 is formed on the front surface side (the lower side in FIG. 2) of the semiconductor substrate 35; on the other hand, a protective layer 44 is formed on the back surface side (the upper side in FIG. 2) of the semiconductor substrate 35 and on the photoelectric conversion element 41, and a planarization layer 43 is formed on the protective layer 44. An on-chip lens 42 is formed on the planarization layer 43. Though not illustrated, a color filter may be formed in the back illumination type solid-state imaging element 10.

[6-3. Front Illumination Type Solid-State Imaging Element]

The solid-state imaging element of the fifth embodiment of the present technology is applicable not only to the back illumination type solid-state imaging element but also to the front illumination type solid-state imaging element. The front illumination type solid-state imaging element will be described.

An example of the front illumination type solid-state imaging element differs from the aforementioned back illumination type solid-state imaging element 10 only in that a wiring layer 92 having been formed at a lower portion of the semiconductor substrate 35 is formed between the photoelectric conversion element 41 and the semiconductor substrate 35. In other points, the front illumination type solid-state imaging element may be the similar to the aforementioned back illumination type solid-state imaging element 10, and description thereof is omitted here.

7. Sixth Embodiment (Example of Electronic Apparatus)

An electronic apparatus in a sixth embodiment of the present technology is an apparatus including the solid-state imaging element of the fifth embodiment of the present technology. The solid-state imaging element of the fifth embodiment of the present technology is as mentioned above, and therefore, description thereof is omitted here. The electronic apparatus of the sixth embodiment of the present technology includes the solid-state imaging element having an excellent photoelectric conversion efficiency, and accordingly, enhancement of performance such as image quality of color images can be realized.

Figure 5:
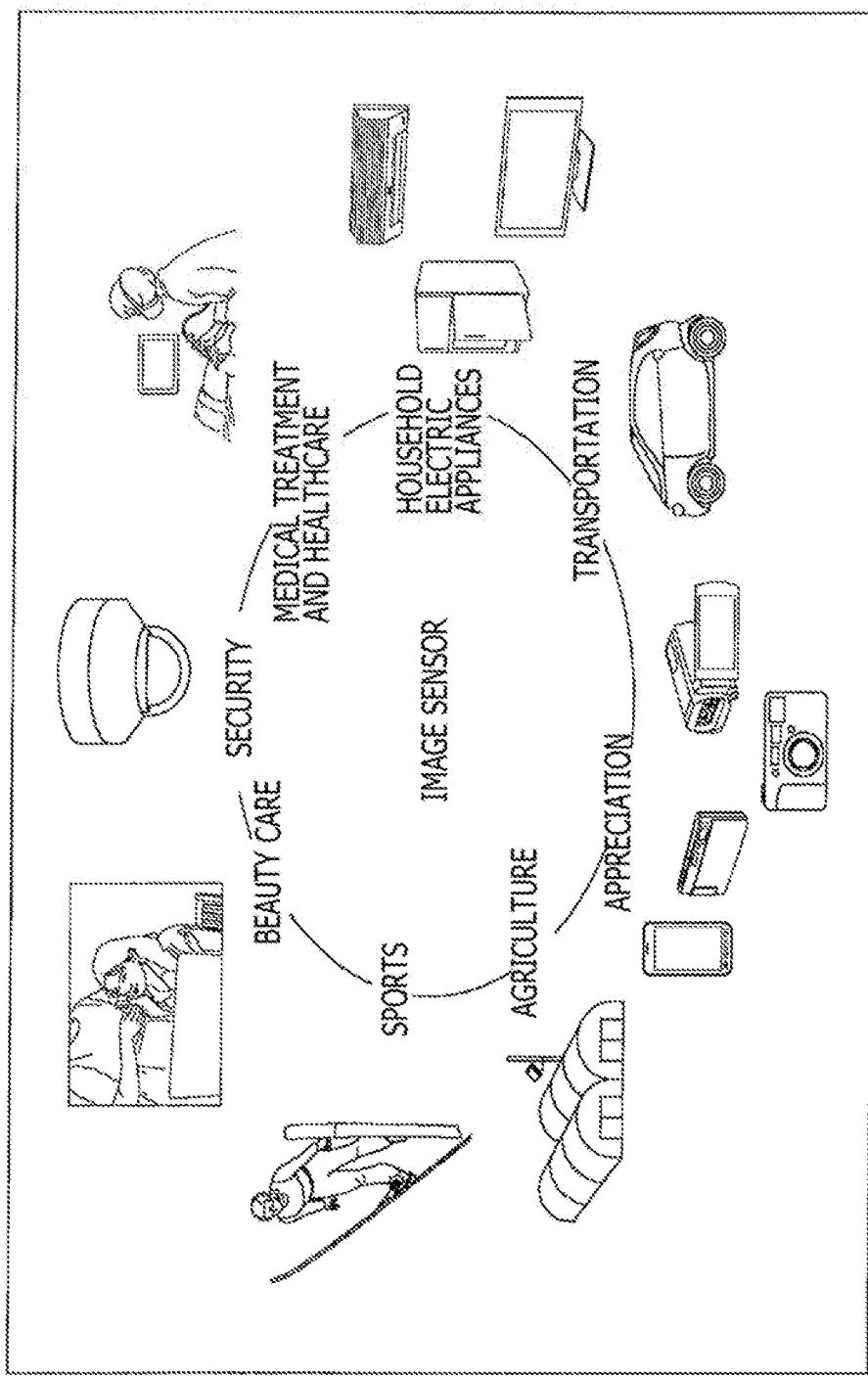
FIG. 5 is a figure illustrating use examples of the solid-state imaging element according to a fifth embodiment to which the present technology is applied.

8. Use Examples of Solid-State Imaging Element to which Present Technology is Applied FIG. 5 is a figure illustrating use examples of the solid-state imaging element of the fifth embodiment of the present technology as an image sensor.

The aforementioned solid-state imaging element of the fifth embodiment can be used in various cases, for example, a case of sensing light such as visible light, infrared light, ultraviolet light, and X-rays as illustrated below. In other words, the solid-state imaging element of the fifth embodiment can be used for apparatuses (for example, the aforementioned electronic apparatus of the sixth embodiment) for use in, for example, a viewing field for imaging images for viewing use, a traffic field, a household appliance field, a medical or healthcare field, a security field, a cosmetic field, a sports field, and an agricultural field.

Specifically, in the viewing field, the solid-state imaging element of the fifth embodiment can be used for apparatuses for imaging images for viewing use, such as, for example, digital cameras, smart phones, and mobile phones provided with a camera function.

In the traffic field, the solid-state imaging element of the fifth embodiment can be used for apparatuses for traffic use, such as, for example, in-vehicle sensors for imaging the front side, the rear side, the surroundings, the interior, etc. of an automobile for the purpose of safe driving, such as automatic vehicle stop, recognition of the driver's condition, etc., monitor cameras for monitoring the running vehicles and/or the road, distance measuring sensors for measuring distances such as inter-vehicle distance, etc.

In the household appliance field, the solid-state imaging element of the fifth embodiment can be used for apparatuses for use in household appliances such as television receivers, refrigerators and air conditioners for the purpose of imaging a user's gesture and performing an apparatus operation according to the gesture, for example.

In the medical or healthcare field, the solid-state imaging element of the fifth embodiment can be used for apparatuses for medical or healthcare use, such as endoscopes and devices for imaging blood vessels by receiving infrared light, for example.

In the security field, the solid-state imaging element of the fifth embodiment can be used for apparatuses for security use, such as surveillance cameras for security and cameras for person authentification, for example.

In the cosmetic field, the solid-state imaging element of the fifth embodiment can be used for apparatuses for cosmetic use, such as a skin measuring instrument for imaging a skin and a microscope for imaging the scalp, for example.

In the sports field, the solid-state imaging element of the fifth embodiment can be used for apparatuses for sports use, such as action cameras and wearable cameras for sports uses or the like, for example.

In the agricultural field, the solid-state imaging element of the fifth embodiment can be used for apparatuses for agricultural use, such as cameras for monitoring conditions of fields and/or farm products, for example.

9. Seventh Embodiment (Example of Light Emitting Device)

A light emitting device in a seventh embodiment of the present technology includes two electrodes disposed to face each other and a semiconductor film disposed between the two electrodes. In this case, the semiconductor film acts as a light emitting film (light emitting layer). The semiconductor film of the first embodiment and the semiconductor film of the second embodiment of the present technology are applicable as this semiconductor film. The semiconductor film of the first embodiment and the semiconductor film of the second embodiment of the present technology are as above-described. In the light emitting device of the seventh embodiment of the present technology, an electron transport layer (n-type buffer layer) may further be disposed between the semiconductor film and the electrode on one side, and a hole transport layer (p-type buffer layer) may further be disposed between the semiconductor film and the electrode on the other side.

With the semiconductor nanoparticles contained in the semiconductor film of the first embodiment and the semiconductor film of the second embodiment of the present technology, the compound represented by the above-mentioned general formula (1) is coordinated as a short ligand at a high coordination rate, and therefore, the surface level of the semiconductor nanoparticles is lowered. It is considered that the surface level of the semiconductor nanoparticles serves as a center of non-light-emitting recombination of electrons and holes present in the same semiconductor nanoparticle. For this reason, when the semiconductor film of the first embodiment and the semiconductor film of the second embodiment of the present technology are made to act as the light emitting layer in the light emitting device of the seventh embodiment of the present technology, non-light-emitting recombination of electrons and holes injected into the light emitting layer from the electron transport layer (n-type buffer layer) and the hole transport layer (p-type buffer layer) can be restrained. Therefore, according to the light emitting device of the seventh embodiment of the present technology, the proportion of light-emitting recombination is increased, and an effect of light emission at a higher luminance is produced. Besides, a display apparatus including the light emitting device of the seventh embodiment of the present technology can realize enhanced display performance.

Note that embodiments of the present technology are not limited to the aforementioned embodiments, and various modifications are possible without departing from the gist of the present technology.

In addition, the effects described in this specification are merely examples but not restrictive, and other effects may also be provided.

Besides, the present technology can also adopt the following configurations.

[1]
A semiconductor film containing semiconductor nanoparticles and a compound represented by the following general formula (1), in which the compound represented by the general formula (1) is coordinated to the semiconductor nanoparticles.

[Chem. 9]

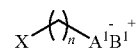

(1)

(In the general formula (1), X represents —SH, —COOH, —NH$_2$, —PO(OH)$_2$, or —SO$_2$(OH), A$^1$ represents —S, —COO, —PO(OH)O, or —SO$_2$(O), and n is an integer of 1 to 3. B$^1$ represents Li, Na, or K.)

[2]
A semiconductor film obtained by coating a substrate with a dispersion containing semiconductor nanoparticles and a compound represented by the following general formula (2), in which the compound represented by the general formula (2) is coordinated to the semiconductor nanoparticles.

[Chem. 10]

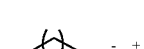

(2)

(In the general formula (2), X represents —SH, —COOH, —NH$_2$, —PO(OH)$_2$, or —SO$_2$(OH), A$^1$ represents —S, —COO, —PO(OH)O, or —SO$_2$(O), and n represents an integer of 1 to 3. B$^2$ represents an imidazolium compound, a pyridinium compound, a phosphonium compound, an ammonium compound, or a sulfonium compound.)

[3]
The semiconductor film as described in [1] or [2], in which the semiconductor nanoparticles selectively absorb at least light in a visible region.

[4]
The semiconductor film as described in any one of [1] to [3], in which the semiconductor nanoparticles selectively absorb at least light in an infrared region.

[5]
A method of producing a semiconductor film, the method including coating a substrate with a dispersion containing semiconductor nanoparticles and a compound represented by the following general formula (2), in which the compound represented by the general formula (2) is coordinated to the semiconductor nanoparticles.

[Chem. 11]

$$X\underset{n}{\overbrace{\phantom{AA}}}A^1 B^{2+} \quad (2)$$

(In the general formula (2), X represents —SH, —COOH, —NH$_2$, —PO(OH)$_2$, or —SO$_2$(OH), A$^1$ represents —S, —COO, —PO(OH)O, or —SO$_2$(O), and n represents an integer of 1 to 3. B$^2$ represents an imidazolium compound, a pyridinium compound, a phosphonium compound, an ammonium compound, or a sulfonium compound.)

[6]
The method of producing the semiconductor film as described in [5], in which the semiconductor nanoparticles selectively absorb at least light in a visible region.

[7]
The method of producing the semiconductor film as described in [5] or [6], in which the semiconductor nanoparticles selectively absorb at least light in an infrared region.

[8]
A photoelectric conversion element including a semiconductor film as described in any one of [1] to [4], and a first electrode and a second electrode which are disposed to face each other, in which the semiconductor film is disposed between the first electrode and the second electrode.

[9]
A solid-state imaging element in which at least a photoelectric conversion element as described in [8] and a semiconductor substrate are stacked, for each of a plurality of pixels arranged on a one-dimensional manner or a two-dimensional manner.

[10]
An electronic apparatus including a solid-state imaging element as described in [9].

EXAMPLES

The effects of the present technology will be described in detail below by providing Examples. Note that the scope of the present technology is not to be limited to or by Examples.

Example 1

[Preparation of Dispersion 1]
Example 1 is an example relating to preparation of Dispersion 1 for use in producing a semiconductor film containing semiconductor nanoparticles, in a photoelectric conversion element using the semiconductor nanoparticles. Specifically, Example 1 is an example in which Dispersion 1 is prepared by using PbS as semiconductor nanoparticles and using tetrabuthylammonium 3-mercaptopropionate as a ligand.

First, 0.1 g of spherical PbS with a diameter of 3 nm as semiconductor nanoparticles to which oleic acid was coordinated was mixed with 5 ml of octane as a solvent, then a methanol solution of 0.1 g of tetrabutylammonium 3-mercaptopropionate was added to the solvent containing the semiconductor nanoparticles, and the resultant mixture was stirred by use of a stirrer at 500 rpm for 12 hours. In the above-mentioned manner, Dispersion 1 of PbS to which tetrabutylammonium 3-mercaptopropionate was coordinated and which was dispersed in methanol was prepared. When Dispersion 1 thus prepared was left to stand at room temperature for one day, precipitation of the semiconductor nanoparticles was not observed, and high dispersion stability was confirmed.

Example 2

[Preparation of Dispersion 2]
Example 2 is an example relating to preparation of Dispersion 2 for use in producing a semiconductor film containing semiconductor nanoparticles, in a photoelectric conversion element using the semiconductor nanoparticles. Specifically, Example 2 is an example in which Dispersion 2 was prepared by using PbS as semiconductor nanoparticles and using hexyltrimethylammonium 3-mercaptopropionate as a ligand.

First, 0.1 g of spherical PbS with a diameter of 3 nm as semiconductor nanoparticles to which oleic acid was coordinated was mixed with 5 ml of octane as a solvent, then a methanol solution of 0.1 g of hexyltrimethylammonium 3-mercaptopropionate was added to the solvent containing the semiconductor nanoparticles, and the resultant mixture was stirred by use of a stirrer at 500 rpm for 12 hours. In the above-mentioned manner, Dispersion 2 of PbS to which hexyltrimethylammonium 3-mercaptopropionate was coordinated and which was dispersed in methanol was prepared. When Dispersion 2 thus prepared was left to stand at room temperature for one day, precipitation of the semiconductor nanoparticles was not observed, and high dispersion stability was confirmed.

Example 3

[Fabrication of Photoelectric Conversion Element 1]
Example 3 is an example relating to fabrication of Photoelectric Conversion Element 1 by use of Dispersion 1 used for producing the semiconductor film containing the semiconductor nanoparticles, in a photoelectric conversion element using the semiconductor nanoparticles. Specifically, Example 3 is an example in which Photoelectric Conversion Element 1 was fabricated by using PbS as nanoparticles contained in Dispersion 1 and using tetrabutylammonium 3-mercaptopropionate as a ligand contained in Dispersion 1.

Figure 3:
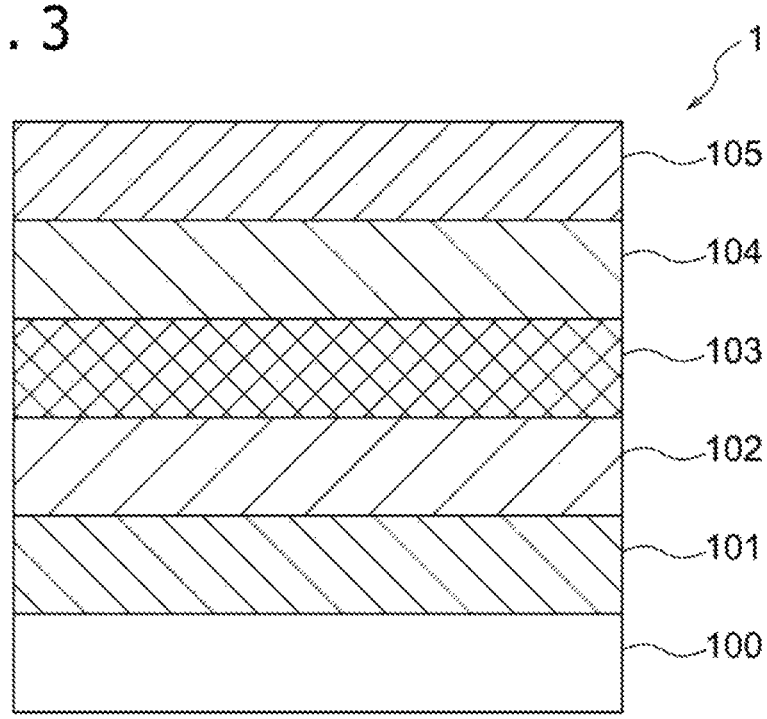
FIG. 3 is a cross-sectional view illustrating schematically a configuration example of a photoelectric conversion element produced in Example 3.

FIG. 3 shows Photoelectric Conversion Element 1 which includes a semiconductor film 103 and which was fabricated in Example 3. In fabricating Photoelectric Conversion Element 1, a first electrode 101 including indium-doped tin oxide was formed in a thickness of 100 nm on a support substrate 100 including a quartz substrate, and an electron transport layer 102 including titanium oxide was formed in a thickness of 20 nm on the first electrode 101. Next, Dispersion 1 in which Pbs with a diameter of 3 nm to which tetrabutylammonium 3-mercaptopropionate was coordinated was dispersed in methanol was applied to the first electrode 101 by spin coating. Subsequently, ion exchange was conducted by dropping an aqueous sodium hydroxide solution to the layer of PbS with a diameter of 3 nm to which tetrabutylammonium 3-mercaptopropionate was coordinated, the layer being formed by spin coating, after which washing with methanol was performed for removing tetrabutylammonium hydroxide produced by the ion exchange. This film forming step was repeated to form the semiconductor film 103 in a thickness of 200 nm. Finally, a hole transport layer 104 including NiO was formed in a thickness of 20 nm, and finally, a second electrode 105 including indium-doped tin was formed in a film thickness of 100 nm, to complete Photoelectric Conversion Element 1 containing the semiconductor nanoparticles.

Example 4

[Fabrication of Photoelectric Conversion Element 2]

Example 4 is an example relating to fabrication of Photoelectric Conversion Element 2 by use of Dispersion 2 used for producing the semiconductor film containing the semiconductor nanoparticles, in a photoelectric conversion element using the semiconductor nanoparticles. Specifically, Example 4 is an example in which Photoelectric Conversion Element 2 was fabricated by using PbS as nanoparticles contained in Dispersion 2 and using hexyltrimethylammonium 3-mercaptopropionate as a ligand contained in Dispersion 2.

Figure 4:
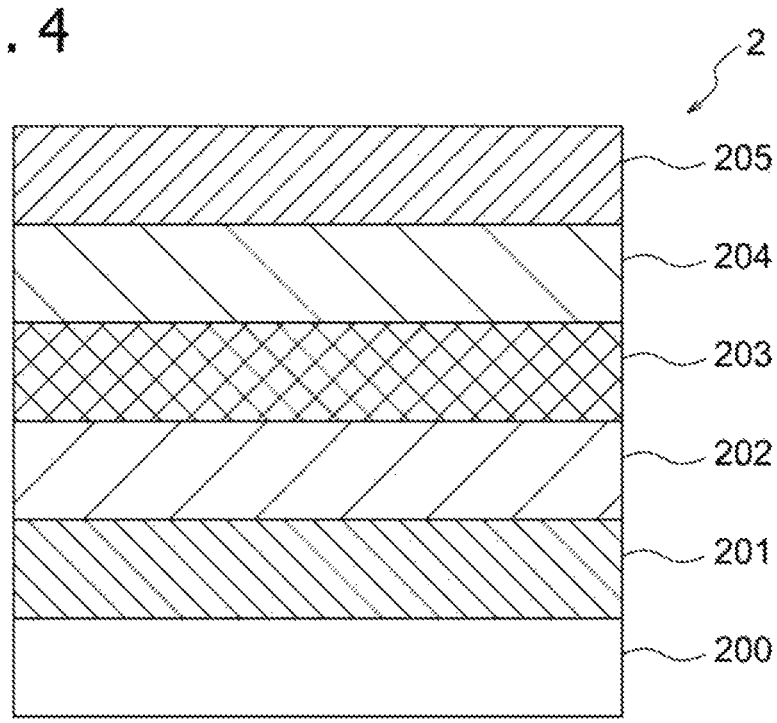
FIG. 4 is a cross-sectional view illustrating schematically a configuration example of a photoelectric conversion element produced in Example 4.

FIG. 4 shows Photoelectric Conversion Element 2 which includes a semiconductor film 203 and which was fabricated in Example 4. In fabricating Photoelectric Conversion Element 2, a first electrode 201 including indium-doped tin oxide was formed in a thickness of 100 nm on a support substrate 200 including a quartz substrate, after which an electron transport layer 202 including titanium oxide was formed in a thickness of 20 nm on the first electrode 201. Next, Dispersion 2 in which PbS with a diameter of 3 nm to which hexatrimethylammonium 3-mercaptopropionate was coordinated was dispersed in methanol was applied to the first electrode 201 by spin coating. Dispersion 2 was applied to the first electrode 201 by spin coating. Subsequently, ion exchange was conducted by dropping an aqueous sodium hydroxide solution to the layer of PbS with a diameter of 3 nm to which hexyltrimethylammonium 3-mercaptopropionate was coordinated, the layer being formed by spin coating, after which washing with methanol was performed for removing hexyltrimethylammnoium hydroxide produced by the ion exchange. This film forming step was repeated, to form the semiconductor film 203 in a thickness of 200 nm. Finally, a hole transport layer 204 including NiO was formed in a thickness of 20 nm, and finally, a second electrode 205 including indium-doped tin was formed in a film thickness of 100 nm, to complete Photoelectric Conversion Element 2 containing the semiconductor nanoparticles.

Comparative Example 1

[Preparation of Metal Halide Precursor]

Cadmium chloride (Sigma-Aldrich, 99.98%) or lead chloride (Alfa Aesar, 99.999%) and TDPA (tetradecylphosphoric acid, Alfa Aesar, 98%) were dissolved in oleylamine (Acros, 80%) at 100° C. with deaeration for 16 hours. A product thus obtained was stored at 80° C. in such a manner as to prevent solidification. As a typical procedure, 0.30 g (1.64 mmol) of cadmium chloride and 0.033 g (0.12 mmol) of TDPA were dissolved in 5 ml of oleylamine, to prepare a precursor having a cadmium/TDPA molar ratio of 13.6:1.

[Synthesis of Semiconductor Nanoparticles and Treatment of Metal Halide]

Synthesis of lead sulfide nanoparticles (quantum dots) was conducted on the basis of a known method. In performing a treatment of a metal halide, 1.0 ml of the metal halide precursor was added to the sulfur source poured into a reaction vessel, followed by cooling slowly. In this synthesis, the lead/cadmium molar ratio was kept at 6:1. When the temperature of the reaction system reached 30° C. to 35° C., 60 mL of acetone was added, and centrifugation was conducted, to separate nanocrystals. The nanocrystals were dispersed in toluene, and reprecipitation was conducted using an acetone/methanol solution having a volume ratio of 1:1, after which the precipitate was dissolved in anhydrous toluene. Further, a product thus obtained was washed two or three times with methanol, and was dispersed in octane (50 mgmL$^{-1}$).

[Fabrication of Photoelectric Conversion Element A]

A lead sulfide nanoparticle (colloid quantum dot) (CQD) film formed by stacking layers through conducting spin coating for each layer in a room temperature atmosphere. For each layer, a CQD solution (50 mgmL$^{-1}$ octane solution) was placed on a zinc oxide/titanium oxide substrate, and spin casting was conducted at 2,500 rpm. In a hybrid and organic technique, the layer surface was immersed in a methanol solution (1% v/v) of 3-marcaptopropionic acid (MPA) for three seconds, and spin coating was performed at 2,500 rpm to effect ligand exchange in a solid state. This operation was repeated until a desired film thickness was reached, to form a semiconductor film A in a thickness of 200 nm. Note that washing with methanol was conducted twice, for removing the ligand loosened from linkage. Using this semiconductor film A, Photoelectric Conversion Element A was fabricated. The method of fabricating Photoelectric Conversion Element A was similar to that of Photoelectric Conversion Elements 1 and 2 in Examples 3 and 4; a quartz substrate, a first electrode, an electron transport layer, the semiconductor film A, a hole transport layer, and a second electrode were stacked sequentially, to complete Photoelectric Conversion Element A.

<Evaluation of Photoelectric Conversion Efficiency>

[Method of Measuring Photoelectric Conversion Efficiency]

Photoelectric conversion efficiency (external quantum efficiency: photon-electron conversion efficiency) of Photoelectric Conversion Element 1 (Example 3), Photoelectric Conversion Element 2 (Example 4) and Photoelectric Conversion Element A (Comparative Example 1) was measured by use of light obtained by narrowing simulated solar light source (AM 1.5, 100 mW/cm$^2$) to monochromatic.

[Measurement Results of Photoelectric Conversion Efficiency]

While the photoelectric conversion efficiency of Photoelectric Conversion Element A (Comparative Example 1) was 40%, Photoelectric Conversion Element 1 (Example 3) and Photoelectric Conversion Element 2 (Example 4) each gave high photoelectric conversion efficiency of 60%. It could be verified that photoelectric conversion efficiency is enhanced by use of Photoelectric Conversion Element (Example 3) and Photoelectric Conversion Element 2 (Example 4).

REFERENCE SIGNS LIST 1, 2 . . . Photoelectric conversion element, 10 . . . Back illumination type solid-state imaging element, 51 . . . Semiconductor nanoparticles, 55 . . . Short ligand, 100, 200 . . . Quartz substrate, 101, 201 . . . First electrode, 102, 202 . . . Electron transport layer, 103, 203 . . . Semiconductor film, 104, 204 . . . Hole transport layer, 105, 205 . . . Second electrode #

What is claimed is:

1. A semiconductor film, comprising:
semiconductor nanoparticles and a compound represented by the following general formula (1):

 (1)

(in the general formula (1), X represents —COOH, —NH$_2$, —PO(OH)$_2$, or —SO$_2$(OH), A$^1$ represents —S, —PO(OH)O, or —SO$_2$(O), and n is an integer of 1 to 3; B$^1$ represents Li or K), wherein the compound represented by the general formula (1) is coordinated to the semiconductor nanoparticles.

2. The semiconductor film according to claim 1, wherein the semiconductor nanoparticles selectively absorb at least light in a visible region.

3. The semiconductor film according to claim 1, wherein the semiconductor nanoparticles selectively absorb at least light in an infrared region.

4. The semiconductor film according to claim 1, wherein the semiconductor nanoparticles include at least one of TiO$_2$, ZnO, WO$_3$, NiO, MoO$_3$, CuO, GazO$_3$, SrTiO$_3$, SnO$_2$, InSnOx, NB$_2$O$_3$, MnO$_2$, V$_2$O$_3$, CrO, CuInSe$_2$, CuInS$_2$, AgInS$_2$, Si, PbS, PbSe, PbTe, CdS, CdSe, CdTe, Fe$_2$O$_3$, GaAs, GaP, InP, InAs, Ge, In$_2$S$_3$, Bi$_2$S$_3$, ZnSe, ZnTe, or ZnS.

5. The semiconductor film according to claim 1, wherein a particle diameter of the semiconductor nanoparticle is 2 to 20 nm.

6. The semiconductor film according to claim 1, wherein a shape of the semiconductor nanoparticle is a sphere, an ellipsoid, or a triangular prism.

7. The semiconductor film according to claim 1, wherein the semiconductor nanoparticles for red light include PbSe, CdTe, PbS, Si, PbTe, CdSe, CuInSe$_2$, CuInS$_2$, AgInS$_2$, MnO$_2$, V$_2$O$_3$, CrO, GaAs, Fe$_2$O$_3$, InP, InAs, Ge, Bi$_2$S$_3$ or CuO.

8. The semiconductor film according to claim 1, wherein the semiconductor nanoparticles for green light include CdS, GaP or ZnTe.

9. The semiconductor film according to claim 1, wherein the semiconductor nanoparticles for blue light include WO$_3$, ZnSe or In$_2$S$_3$.

* * * * *